United States Patent
Ryding et al.

(10) Patent No.: US 8,324,592 B2
(45) Date of Patent: Dec. 4, 2012

(54) ION SOURCE AND A METHOD OF GENERATING AN ION BEAM USING AN ION SOURCE

(75) Inventors: Geoffrey Ryding, Manchester, MA (US); Drew Arnold, Salem, MA (US); William H. Park, Somerville, MA (US); Ronald Horner, Auburndale, MA (US)

(73) Assignee: Twin Creeks Technologies, Inc., San Jose, CA (US)

( * ) Notice: Subject to any disclaimer, the term of this patent is extended or adjusted under 35 U.S.C. 154(b) by 218 days.

(21) Appl. No.: 12/917,510

(22) Filed: Nov. 2, 2010

(65) Prior Publication Data
US 2012/0104273 A1    May 3, 2012

(51) Int. Cl.
*H01J 27/00* (2006.01)
*H01J 27/02* (2006.01)
*H01J 27/04* (2006.01)

(52) U.S. Cl. .................. 250/423 R; 250/424; 250/492.1; 250/492.2; 250/492.22; 250/492.3; 315/111.01; 315/111.21; 315/111.41

(58) Field of Classification Search .............. 250/423 R, 250/424, 425, 426, 427, 423 P, 423 F, 492.1, 250/492.2, 492.22, 492.3; 315/111.01, 111.11, 315/111.21, 111.31, 111.41, 111.61, 111.71, 315/111.81
See application file for complete search history.

(56) References Cited

U.S. PATENT DOCUMENTS

| | | | |
|---|---|---|---|
| 4,831,270 A | 5/1989 | Weisenberger | |
| 5,389,793 A | 2/1995 | Aitken et al. | |
| 5,834,786 A | 11/1998 | White et al. | |
| 6,770,888 B1 | 8/2004 | Benveniste et al. | |

OTHER PUBLICATIONS

Makov, B.N., "A source with ion extraction from plasma volume", Rev. Sci. Instr., vol. 71, No. 11, Nov. 2000.

*Primary Examiner* — Michael Maskell
*Assistant Examiner* — Hanway Chang
(74) *Attorney, Agent, or Firm* — The Mueller Law Office, PC

(57) ABSTRACT

Multiple control electrodes are provided asymmetrically within the plasma chamber of an ion source at respective positions along the length of the plasma chamber. Biasing the control electrodes selectively can selectively enhance the ion extraction current at adjacent positions along the length of the extraction slit. A method of generating an ion beam is disclosed in which the strengths of the transverse electric fields at different locations along the length of the plasma chamber are controlled to modify the ion beam linear current density profile along the length of the slit. The method is used for controlling the uniformity of a ribbon beam.

27 Claims, 7 Drawing Sheets

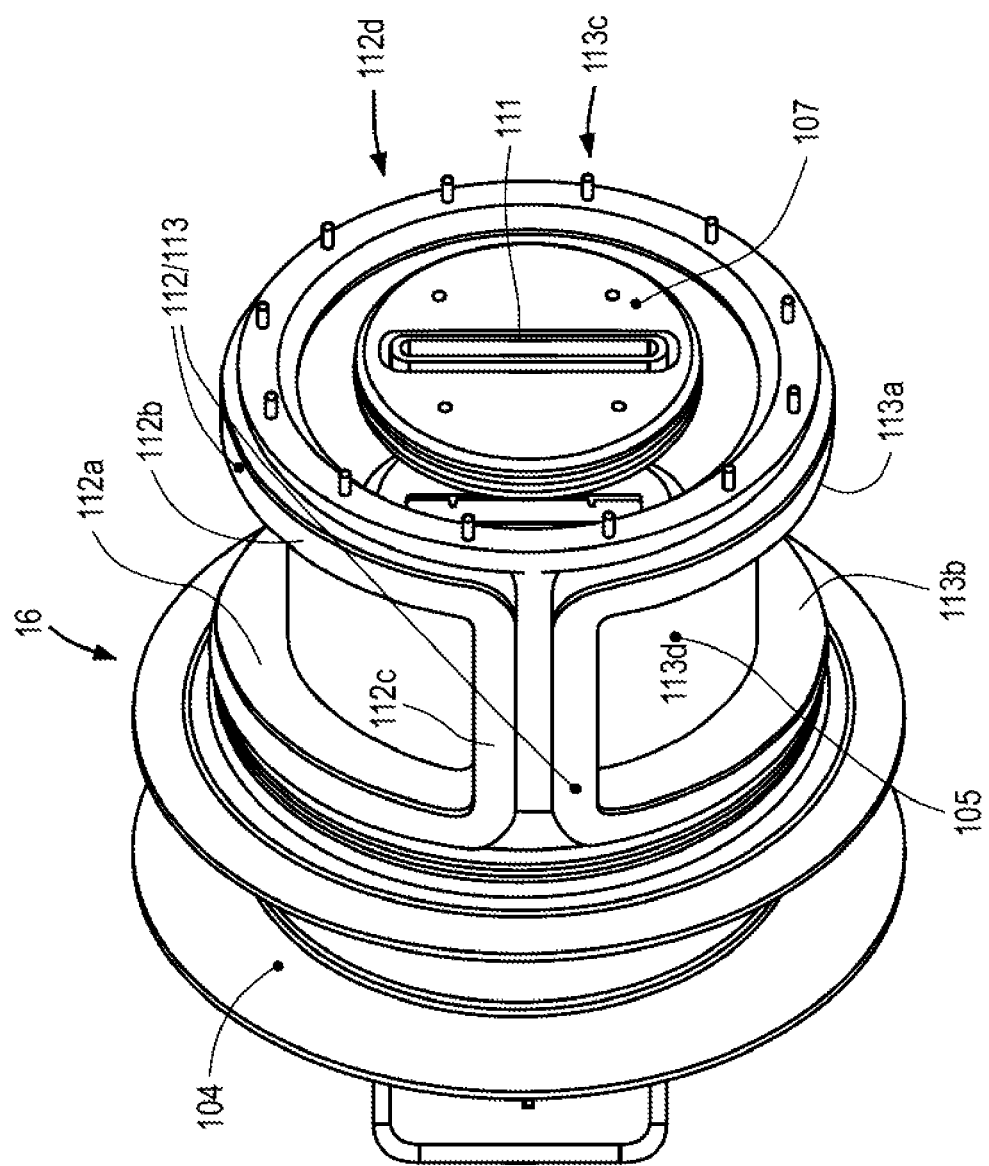

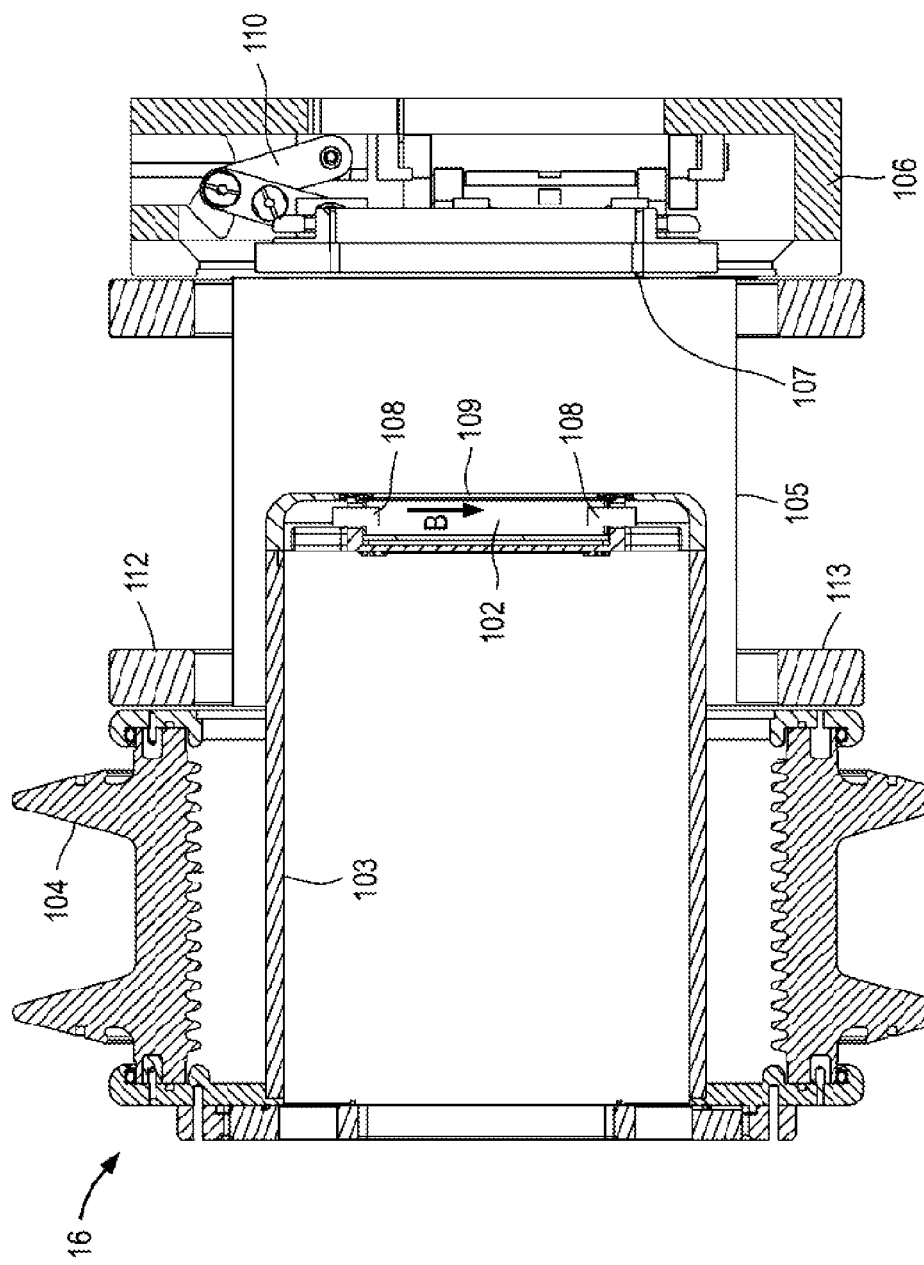

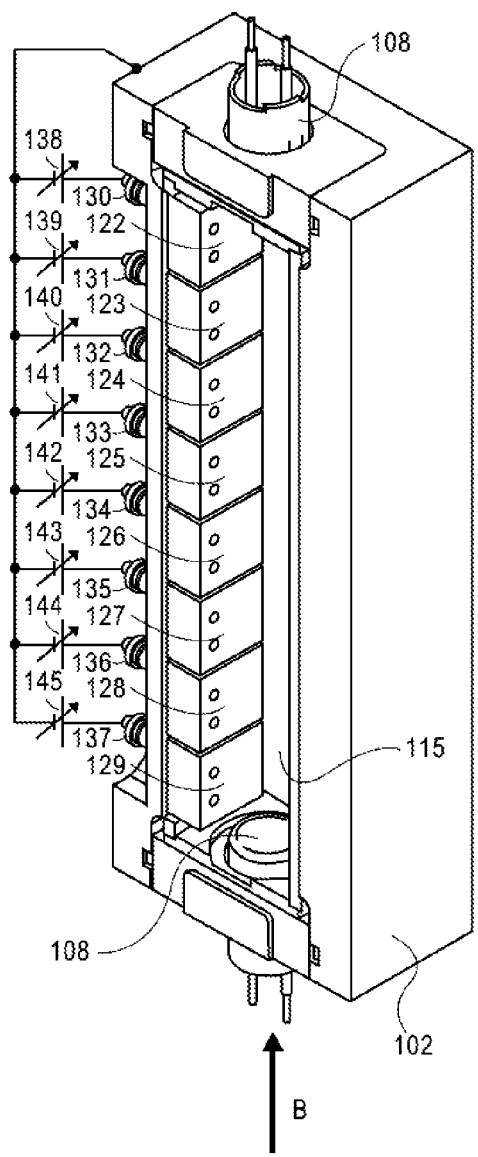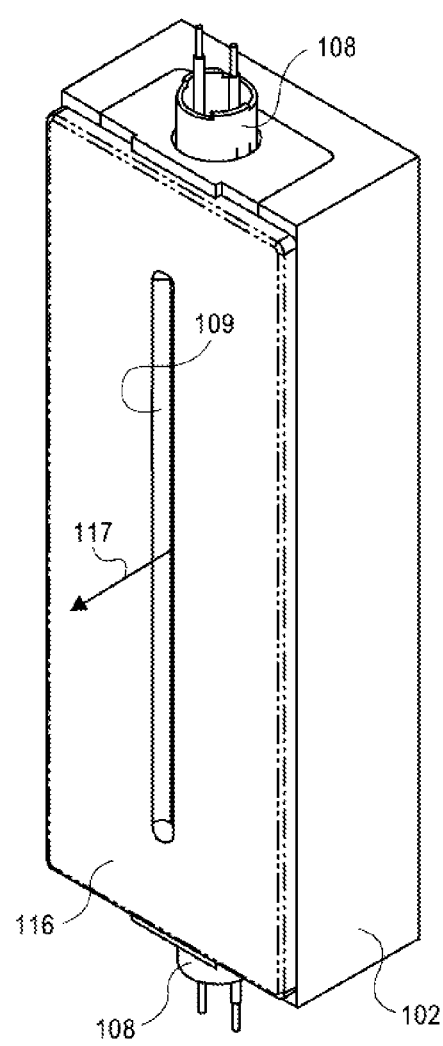

ION SOURCE AND A METHOD OF GENERATING AN ION BEAM USING AN ION SOURCE

BACKGROUND

1. Field of the Invention

This invention relates to an ion source and a method of generating an ion beam using an ion source. In particular, the invention is concerned with an ion source having a plasma chamber which contains a cathode for generating a plasma in the chamber and which uses a magnetic field generator to produce a magnetic field extending in a magnetic field direction in the chamber. Ion sources are commonly used in ion implantation apparatuses in which a beam of desired ions is generated and directed at a substrate, typically a semiconductor wafer, for example a silicon wafer.

2. Background Information

It is a normal requirement in ion implantation, that ions are implanted uniformly over the surface of the semiconductor wafer. On the other hand, the ion beam impinging on the wafer during the implant process typically has a beam cross-section which is substantially less than the area of the wafer. To achieve uniform implantation over the wafer surface, various techniques are used to achieve a relative scanning action between the wafer and the ion beam.

A known type of ion implantation tool has an ion source which produces a beam containing ions to be implanted. The ion beam is directed through a region of homogenous magnetic field in an ion filter to provide spatial separation between ions in the beam with different momentum over charge (mv/e) ratios. A mass selector slit blocks any unwanted ions and allows desired ions to pass, optionally through an electrostatic accelerator, to a process chamber for implantation in semiconductor substrates or wafers. To improve productivity, a batch of wafers may be processed simultaneously by mounting them round the periphery of a process wheel mounted for rotation about an axis, so that the wafers on the wheel pass one after the other through the ion beam. The process wheel axis may at the same time be translated towards and away from the beam to provide a two-dimensional mechanical scan of the wafers through the ion beam, to provide the required uniform implantation over the full area of the wafers on the process wheel.

A further known type of implantation tool produces a so-called ribbon beam of ions, having a major dimension which is sufficient to extend right across a single wafer. A ribbon beam arrangement of this kind requires the wafer to be mechanically scanned only in one dimension, transverse to the ribbon beam plane.

BRIEF SUMMARY OF THE INVENTION

The invention provides an ion source comprising a plasma chamber having a length and a cathode in the plasma chamber for generating a plasma in the chamber. A magnetic field generator produces a magnetic field said chamber extending in a magnetic field direction along said length. The plasma chamber has a front plate defining an ion extraction slit having a centre and extending lengthwise of said plasma chamber, whereby charged particles in a plasma formed in said plasma chamber can be extracted through the slit in an extraction direction along an extraction axis through said centre of said slit. The magnetic field direction and the extraction axis between them define a central plane in said chamber. Said ion source further includes a first control electrode in said plasma chamber located asymmetrically relative to said central plane and at a first control position along said length of said chamber, a second control electrode said plasma chamber located asymmetrically relative to said central plane and at a second control position, displaced from said first control position, along said length of said chamber, and respective first and second control terminals connected to said first and second control electrodes for applying respective bias voltages to said first and second control electrodes.

With these additional control electrodes within the plasma chamber of the ion source, the extracted ion current can be controlled at different corresponding locations along the length of the extraction slit, so as to provide a desired adjustment of the profile of linear current density over the length of the slit. For example, the linear current density may be made more uniform over the length of the slit by adjusting the biases applied to the control electrodes. The plasma chamber may provide at least one reference electrode which extends over both said first and second control positions along the length of said chamber whereby the respected bias voltages are applied to said first and second control electrodes with respect to the reference electrode. In practice, the reference electrode may be constituted by the anode of the plasma chamber, which may in turn be formed by the casing of the plasma chamber.

The reference electrode should be located relative to the central plane such that the bias voltages, when applied to the control electrodes, provide respective regions of electric field in said chamber in which the electric field extends transversely to said central plane, the respective electric field regions being located along the length of the chamber in accordance with said control positions of said control electrodes.

One or more further control electrodes may be provided in the plasma chamber located at respective further control positions, displaced from other said control positions, along the length of said chamber. Additionally, control terminals may be connected to said further control electrodes for applying respective further bias voltages to said further control electrodes. There may be at least five and optionally eight said control electrodes with respective said control terminals distributed along said length of said chamber.

The invention also provides a method of generating an ion beam using an ion source comprising a plasma chamber having a length and a cathode in the plasma chamber for generating a plasma in the chamber, a front plate of the plasma chamber defining an ion extraction slit having a centre and extending lengthwise of said plasma chamber. A magnetic field is produced in said chamber extending in a magnetic field direction along said length. A plasma containing ions for said ion beam is generated within this chamber. Ions from said plasma are extracted through said extraction slit in an extraction direction along an extraction axis through said centre of said slit. The magnetic field direction and the extraction axis define a central plane in said chamber. First and second electric fields are applied transversely to said central plane in respective first and second regions at first and second control positions along said length of said chamber. The first and second control positions are displaced from each other. The strengths of the first and second electric fields are controlled to apply a desired modification to the profile along the extraction slit of the linear current density of ions being extracted through the slit.

The magnetic field may have a predetermined polarity in said plasma chamber and said first and second electric fields may be selected to have a polarity, dependant on said predetermined magnetic field polarity, such that ions in the plasma are urged towards said extraction slit.

One or more further electric fields may be applied transversely to said central plane in further regions at further respective control positions, displaced from other said control positions, along the length of the chamber. The strength of said further electric fields are also controlled to modify the linear density of the extracted ion current as required.

The present invention further provides a method of controlling the uniformity of a ribbon beam extracted through an elongate slit in a front plate of a plasma chamber of an ion source which uses a cathode to produces a plasma in the plasma chamber and in which a magnetic field extends through the plasma chamber. The method includes applying to plasma within the plasma chamber of the ion source electric fields transverse to the ion extraction direction through the slit and also to the magnetic field in the plasma chamber, so that charged particles in the plasma are urged transversely to both the magnetic and electric fields. By adjusting at least one of the polarities and the relative strengths of the electric fields at different locations along the elongate slit, the profile along the elongate slit of the linear current density of ions in the ribbon beam can be modified. In one example, the relative strengths of the electric fields are adjusted to make the linear current density profile more uniform across the ribbon beam.

BRIEF DESCRIPTION OF THE DRAWINGS

Examples of the invention will be described below with reference to the accompanying drawings in which:

FIG. 3 is a perspective view of an ion source for the implanter of FIGS. 1 and 2.

FIG. 4 is a schematic sectional view of the ion source of FIG. 3.

FIG. 5 is a perspective view of a plasma chamber for use in the ion source of FIGS. 3 and 4.

FIG. 6 is a perspective view of the plasma chamber of FIG. 5, with the front plate removed to expose the interior of the plasma chamber.

DETAILED DESCRIPTION OF THE INVENTION

Figure 1:
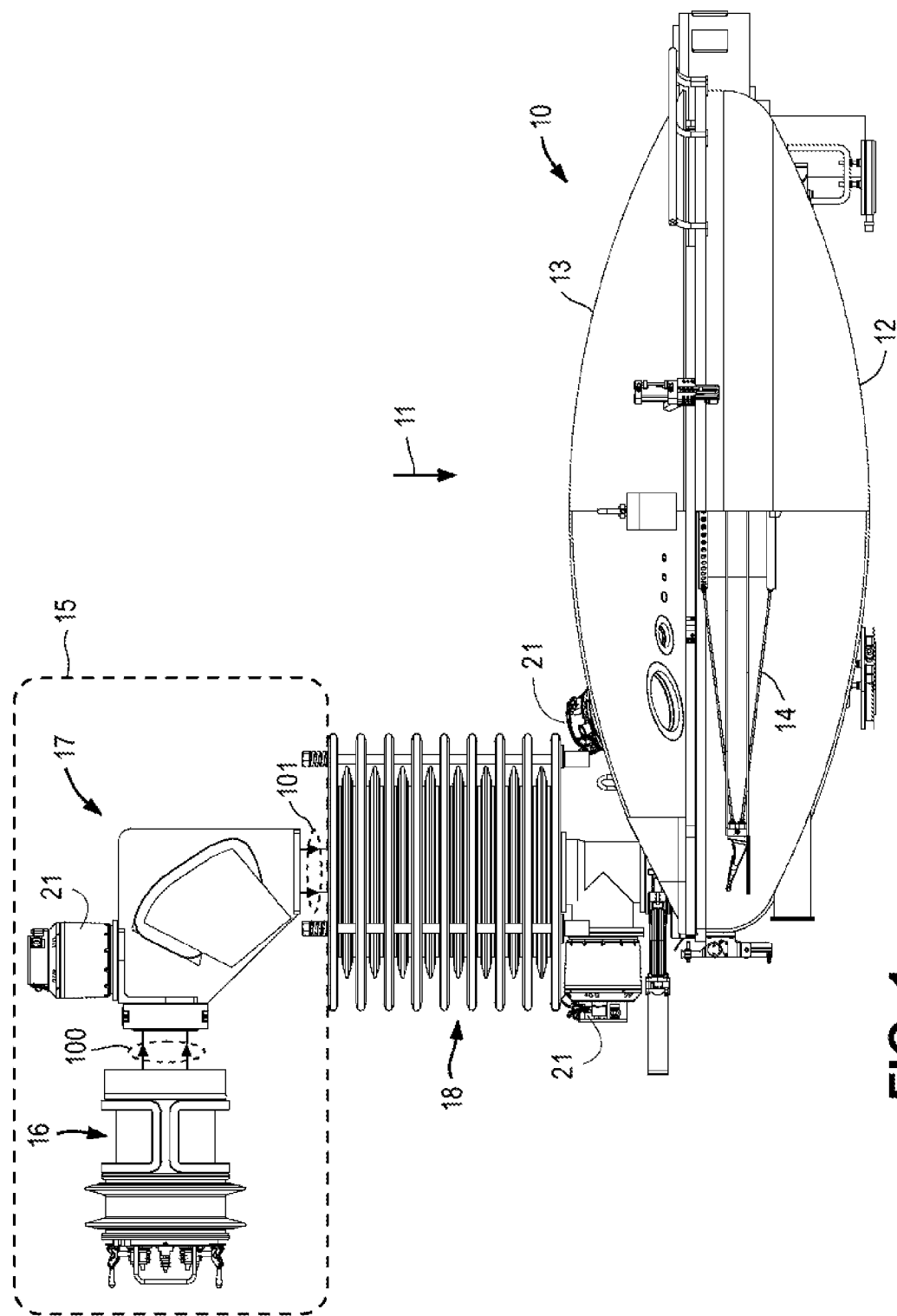
FIG. 1 is a schematic view in elevation and partially cut away of an ion implanter which may include an ion source embodying the present invention.

Embodiments and examples of the present invention provide a system and method for ensuring a desired uniformity of ion implantation across the wafer in the direction of the plane of the ribbon beam. As a result the ribbon beam can having a well controlled profile over the major dimension of the ribbon of the linear current density of ions in the ribbon beam. The linear current density is a measure of the ion beam intensity per unit length along the major dimension of the ribbon beam. Examples of the invention are applicable particularly to ion sources of the Penning Ionisation Gauge (PIG) type, more particularly the Bernas type FIG. 1 is a schematic illustration of ion implantation apparatus which may incorporate examples of the present invention. Ion implantation is conducted in a vacuum environment and the main operative features of the embodiment are contained within a vacuum chamber. In the illustrated embodiment in FIG. 1, the vacuum chamber is shown in three interconnected parts. The first part is a process chamber 10 which has a circular profile when viewed from above in FIG. 1 along the direction of arrow 11. The process chamber 10 comprising a part spherical lower wall section 12 and an opposed part spherical upper wall section 13, forming a disc shaped vacuum enclosure which is thickened at the center of the disc. This process chamber 10 contains a process wheel or implant wheel 14 extending in the plane of the process chamber 10 for rotation about a vertical axis aligned substantially with the center of the disc. Wafer substrates for processing are carried in the process chamber 10 about the periphery of the implant wheel 14, as will be described and illustrated later in greater detail.

A second part of the vacuum chamber is contained in a high voltage enclosure 15 and is constituted by an ion source structure 16 and a mass selection magnet structure 17. A beam of ions desired for implantation (in one embodiment, $H^+$ ions) is produced in the ion source structure 16 and directed into the magnet structure 17. The magnet structure 17 is effective to bend the ion beam, allowing unwanted ions in the beam to be filtered from the continuing beam which is directed towards the process chamber 10. Mass selection structures such as structure 17 are well known and will not be described in greater detail herein. For example, U.S. patent application Ser. No. 12/494,272 to Glavish et al filed on Jun. 30, 2009 and assigned to the assignee of the present invention, describes a mass selection structure, and the disclosure of this US patent application is incorporated herein by reference in its entirety for all purposes A third part of the vacuum chamber is constituted by an accelerator tube 18 which interconnects the high voltage part of the vacuum chamber within the high voltage enclosure 15 and the process chamber 10. The accelerator tube 18 comprises an electrically insulating element to allow the ion source and mass selection structures 16 and 17 to be held at a very high voltage relative to the process chamber 10. Electrodes contained in the accelerator tube are electrostatically biased to accelerate the ion beam directed from the mass selection structure 17 to the required implant energy for delivery to the process chamber 10. All parts of the vacuum chamber are pumped down by one or more vacuum pumps, particularly turbo pumps as shown in FIG. 1 at 21

Figure 2:
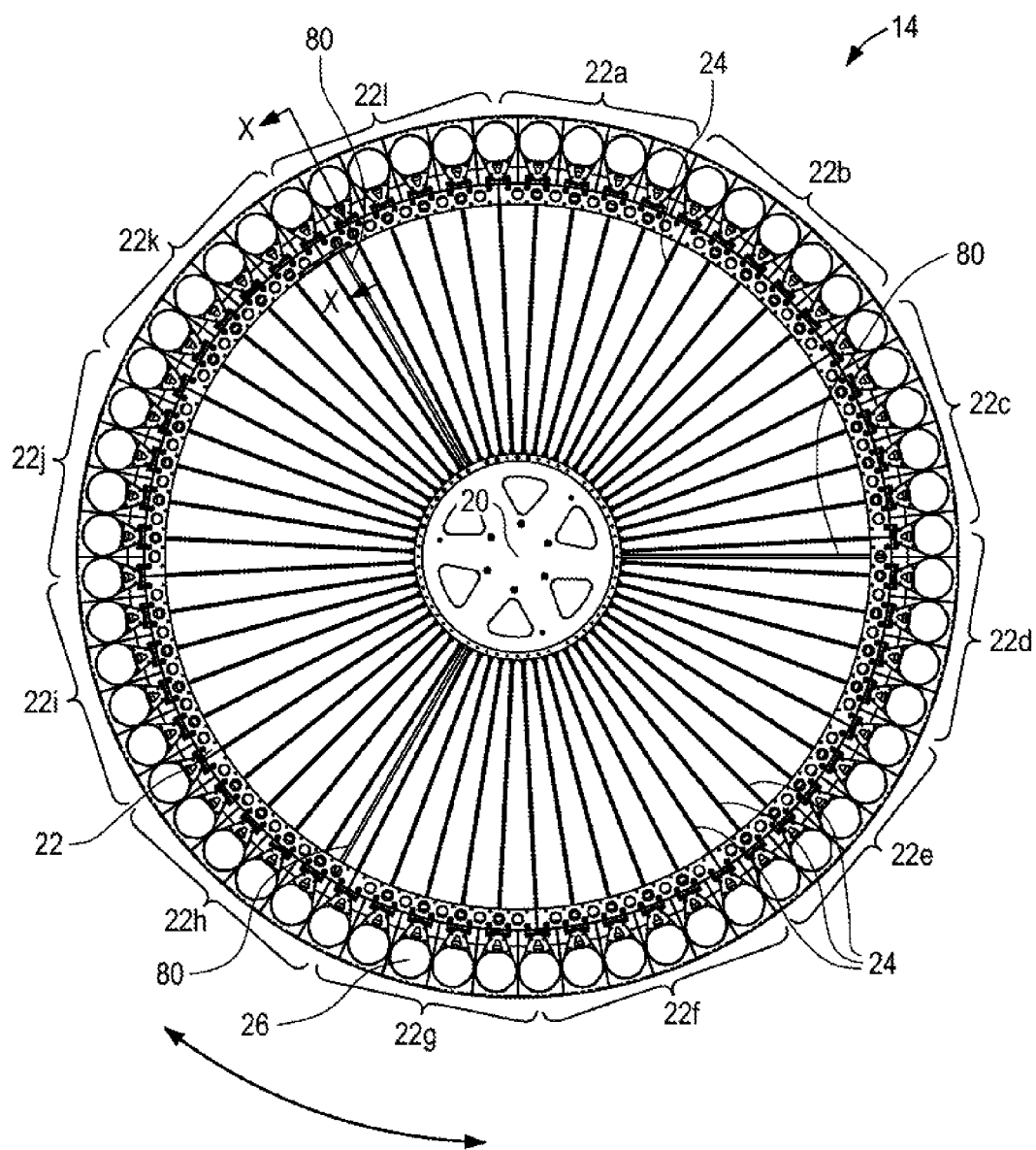
FIG. 2 is a plan view of the implanted wheel of the ion implanter of FIG. 1.

Turning now to FIG. 2, a plan view of the implant wheel 14 is shown. The implant wheel comprises a hub 20 and a rim 22 connected to the hub 20 via a plurality of spokes 24. The rim 22 is formed as a plurality (twelve in this embodiment) of segments 22a, 22b . . . 22l each of which form, in the embodiment of FIG. 2, a 30° arc of the rim.

Each segment of the rim 22 in turn carries a plurality of equidistantly spaced substrate supports or wafer carriers 26, extending radially outwardly from the rim segments. This plurality may be five, as in FIG. 2; so that the implant wheel 14 of FIG. 2 thus carries 60 wafer carriers 26 around the rim 22. Each of the wafer carriers 26 provides a wafer support surface which is shaped and sized to match or be similar to the substrate wafer to be processed. For example, if the substrate wafer to be processed is a 150 mm circular wafer, the support surfaces of the supports 26 are made of similar size and shape and the diameter of the implant wheel is such as to provide a peripheral circumference of at least 60×150 cm so that the 60 supports (and 60 wafers on the supports) are accommodated around the implant wheel periphery without overlapping.

Instead of 150 mm circular support surfaces, other shapes and sizes may be provided to accommodate other wafer shapes and sizes.

Further details of the structure of the implant wheel 14 can be derived from the above referred U.S. patent application Ser. No. 12/494,272.

An important feature of this embodiment of the invention is that the scan wheel 14 rotates about an axis which is fixed, and the beam projected onto the wheel periphery to implant wafers moving through the implant position as the wheel spins, is a ribbon beam having a major dimension which is aligned radially with respect to the wheel axis and has a length which is equal to or greater than the radial extent of wafers mounted on the wafer supports at the wheel periphery. This ribbon beam can be regarded as fixed in the sense that the beam is not scanned to extend implant coverage over the substrate. However, a small amount of positional jitter may be introduced in the plane the ribbon beam in order to smooth out any small scale non-uniformities in the beam across the ribbon. Such jitter may be periodic with a period which is short compared to the duration of a total implant, and the spatial amplitude of the jitter is small compared to the length of the ribbon beam cross-section.

For practical purposes, the smallest wafer size likely to be useful in the described process is at least a 100 mm in diameter (assuming a circular wafer). Non-circular wafers are also contemplated and these are available in the general form of a square or a square with rounded or clipped corners. In any case, if the greatest radial dimension of wafers mounted on the wheel periphery is 100 mm, then the major dimension of the ribbon beam in the radial direction must be in excess of 100 mm. Furthermore, it is desirable to ensure that the ions, such as $H^+$ ions, are implanted into the wafers uniformly over the wafer area, so that there is a dosage variation over the wafer which is preferably less than 10%. Greater uniformity can also be desirable where demanded by the process In order to provide a ribbon beam projected onto the wafers in the process chamber 10 which has a major cross-sectional dimension in excess of 100 mm, it is convenient to ensure that the beam extracted from the ion source 16 also is formed as a ribbon with a major dimension of comparable size.

FIGS. 3 and 4 illustrate an ion source, embodying the present invention, which may form the ion source 16 of the ion implanter described herein. FIG. 4 is a sectional view of the ion source of FIG. 3, with the section taken along the beam axis of the ion source and in the plane of the extracted ribbon beam. Importantly, in FIG. 1, the beam 100 extracted from the ion source 16 is formed as a ribbon in the plane of the paper, so that the magnetic filter structure 17 in FIG. 1 bends this beam substantially through a right-angle, also in the plane of the paper, that is to say in the ribbon beam plane. Then the resulting ribbon beam 101, now containing only desired ions, emerging from the magnetic filter 17 has its major dimension aligned radially with respect to the rotational axis of the wheel 14 as desired.

The structure of the ion source illustrated in FIGS. 3 and 4 will be, in many respects known to those familiar with this art. A plasma chamber 102, which may also be referred to in this embodiment as a discharge chamber or arc chamber, is mounted at one end of a mounting cylinder 103, which is in turn mounted to a left hand end (in FIG. 4) of an insulting bushing 104. The right end of the cylindrical insulting bushing 104 is connected to a cylindrical element 105, which forms part of the vacuum chamber of the device. The cylindrical element 105 supports at its right hand end an arrangement 106 for moveably supporting extraction electrodes 107.

The extraction electrodes 107 are illustrated apparently "floating" in FIG. 3 for clarity.

In operation, a low pressure arc discharge is formed within the discharge chamber 102 of the ion source, by applying a discharge voltage between the body of the discharge chamber 102 and opposed cathodes 108. The cathodes 108 are biased negatively with respect to the body of the discharge chamber and arranged to emit electrons into the interior of the arc chamber which are then accelerated by the bias voltage. The cathodes 108 are typically heated to provide thermionic emission of electrons and the heating may be either direct or indirect in accordance with known art.

A gas containing atoms of the species desired to implanted is introduced into the arc chamber 102 by a conduit which is not shown in FIG. 4. In an embodiment, this gas may be hydrogen. Then, the energetic electrons emitted by the cathodes 108 interact with molecules of the hydrogen gas, to produce a plasma containing $H^+$ ions.

A front wall, on the right in FIG. 4, of the arc chamber 102 contains an extraction slit 109, through which desired ions can be extracted from the ion source to form the desired ion beam. To operate the ion source, the extraction electrodes 107 are transferred, by operating the linkages 110, to the left in FIG. 4 to be proximate to the front face of the arc chamber outside the slit 109. The body of the arc chamber 102 is biased positively relative to the extraction electrodes 107, to provide an electric field between the extraction electrodes 107 and plasma within the arc chamber 102, which draws positive ions from the arc chamber out through the slit 109 and through corresponding slits in the electrodes 107 to form the desired ion beam.

Importantly, in this embodiment, the extraction slit 109 of the ion source is relatively long in the plane of the paper of FIG. 4, substantially matching the dimensions of the slits 111 (FIG. 3) in the extraction electrodes 107, in order that the beam extracted from the ion source has the desired shape as a ribbon beam with a major dimension, in the plane of the paper of FIG. 4, which may be 100 mm or more, for example sufficient to extend over the full width of wafers to be implanted.

It is normal practice for an ion source of the type described, to apply a magnetic field extending within the arc chamber 102 of the ion source in a direction parallel to the extraction slit 109, and between the opposed cathodes 108, in the direction of the arrow marked B in FIG. 4. The magnetic field B in the arc chamber 102 tends to confine electronics being accelerated from the cathodes 108 to a region along the line between the two cathodes, because the electrons are forced to spiral around the flux lines of the magnetic field. In this way, the desired plasma in the arc chamber 102 is produced more efficiently and is also confined by the magnetic field to this linear region, immediately in front of the extraction slit 109 in the front face of the chamber.

In the present embodiment, the magnetic field B within the arc chamber 102 is produced by a pair of saddle coils 112, 113 located outside and around the cylindrical element 105 and surrounding the arc chamber 102. The functioning and performance of the saddle coils in producing the required magnetic field B within the arc chamber is explained in greater detail in the above referred U.S. patent application Ser. No. 12/494,272. Other arrangements for generating the required magnetic field may be employed.

FIGS. 5 to 9 are detailed views of the discharge chamber 102 shown in FIG. 4. The discharge chamber 102 is more generally described as a plasma chamber and forms the core of an ion source of the Penning Ionization Gauge (PIG) type. In a PIG type ion source, a discharge is formed between cathodes 108 located at opposite ends of an elongate discharge chamber 115. The casing of the plasma chamber 102 provides the anode, and electrons released from the cathodes 108 are confined in a central region extending between the cathodes 108, by the magnetic field, indicated in FIGS. 4 and 6 by the arrow B, extending along the length of the plasma chamber between the cathodes 108.

The magnetic field in the plasma chamber is applied by an external magnet, typically an electromagnet, such as described above with reference to FIGS. 3 and 4.

Figure 9:
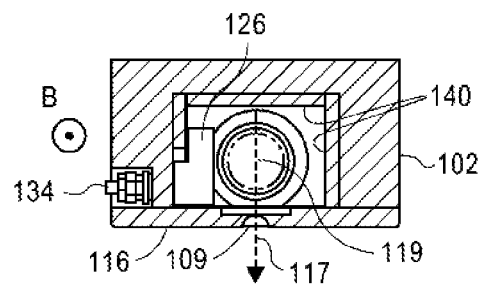
FIG. 9 is a cross-sectional view from one end of the plasma chamber taken along line Y-Y of FIG. 7.
Figure 7:
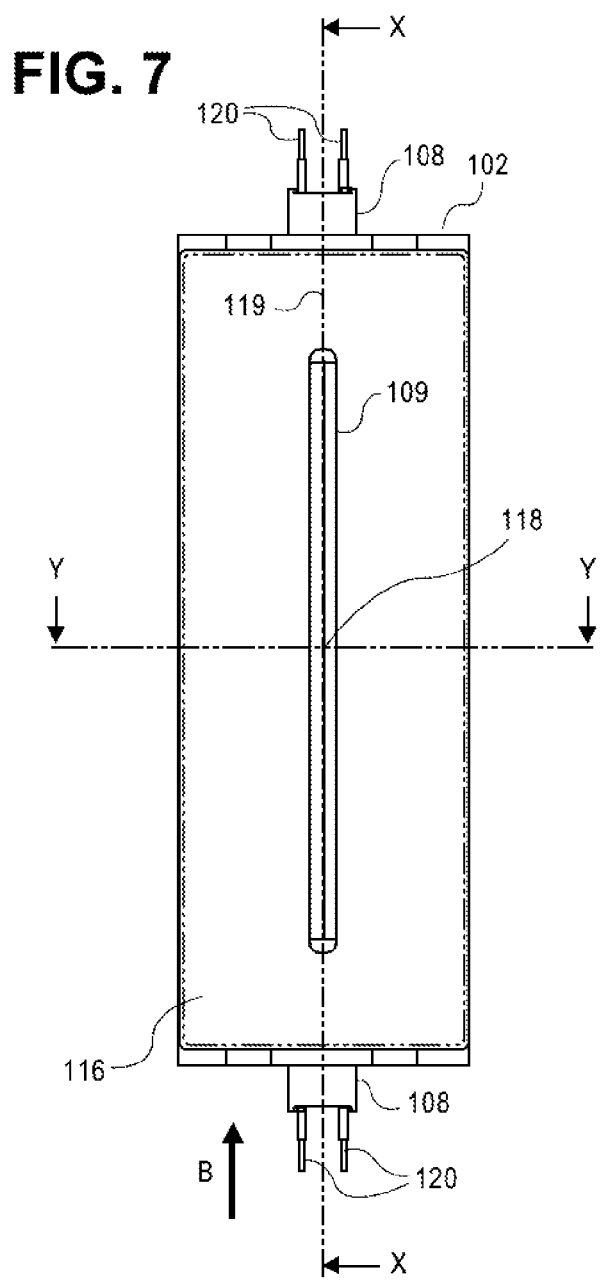
FIG. 7 is a front view in elevation of the plasma chamber of FIGS. 5 and 6.
Figure 8:
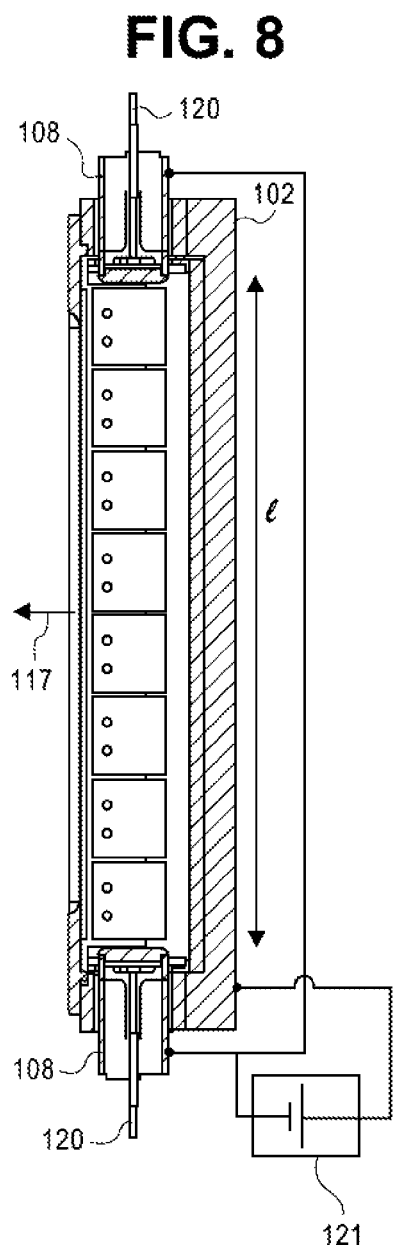
FIG. 8 is a cross-sectional view of the plasma chamber taken along line X-X of FIG. 7.

FIG. 5 shows the plasma chamber 102 complete with a front face 116 in which is formed the ion extraction slit 109. In FIG. 6, the front face 116 is removed to expose the interior of the plasma chamber. FIG. 7 is a front elevation of the plasma chamber showing the extraction slit 109 positioned symmetrically and aligned along the long dimension of the plasma chamber 102. FIG. 8 is a cross-sectional view taken along X:X of FIG. 7, and shows the interior length of the plasma chamber 102, illustrated by the line I. An ion extraction axis 117 is defined as a normal through a centre point 118 along the length of the extraction slit 109. A central plane 119 of the plasma chamber 102 is defined by the extraction axis 117 and the magnetic field direction, indicated by arrow B. The central plane 119 is illustrated in FIG. 7 by the section line X:X, and extends normal to the paper. FIG. 9 is a cross-sectional view of the plasma chamber 102 taken along the line Y:Y in FIG. 7, through the centre point 118 of the slit 109.

As best seen in FIG. 8, the cathodes 108 are formed as indirectly heated cathodes. Indirectly heated cathodes are known to those skilled in the art and typically comprise a cathode button mounted on the interior end of a cylindrical structure. The button is then heated from behind by a separate filament which is negatively biased relative to the cathode button so that electrons released from the filament are accelerated and deliver energy to the rear of the cathode button. Filament legs 120 are shown (see FIG. 7) extending from the outer open ends of the cathode cylinders. These filament legs are normally connected to a filament supply, as well understood by the skilled person.

In order to form a discharge within the plasma chamber 102, a discharge supply 121, shown schematically in FIG. 8, is connected between the casing of the plasma chamber 102, and the two cathodes 108. In this way, the cathodes are biased negatively relative to the casing 102 which forms an anode.

As mentioned previously, the ion source is in a vacuum environment and a desired source gas is delivered to the interior of the plasma chamber 102, through an appropriate conduit which, for clarity has not been shown in the Figures. The discharge voltage from the supply 121 produces electrons within the plasma chamber of sufficient energy to ionize the source gas, thereby producing a plasma within the plasma chamber. Because of the magnetic field B, extending along the length I of the plasma chamber, electrons released from the cathodes 108, are confined to the central region, essentially linking the cathodes 108, and the plasma generated within the plasma chamber is correspondingly confined.

Ions from the plasma within the plasma chamber 102 are drawn through the extraction slit 109 in the direction of the extraction axis 117 by an externally applied electric field, using extraction electrodes as desired previously with reference to FIGS. 3 and 4.

Referring now to FIGS. 6 and 8, a plurality of control electrodes 122-129 are shown distributed down one lateral side of the interior of the plasma chamber 102. Each of the control electrodes 122-129 is insulated from neighboring control electrodes and also from the casing of the plasma chamber 102, and is provided with a respective external control terminal 130-137, by which a respective bias voltage can be supplied to the control electrode.

As illustrated schematically in FIG. 6, respective variable voltage supplies 138 are individually connected to the terminals 130 to apply a desired bias voltage to the terminal with respect to the casing of the plasma chamber 102, which as explained previously also constitutes the plasma chamber anode. Using the control terminals 130-137, the voltage supplies 138-145 apply respective bias voltages to the control electrodes 122-129. Because the voltage supplies 138-145 apply the bias voltages between the respective control terminals 130-137, and the casing of the plasma chamber 102, the plasma chamber casing effectively constitutes a reference electrode for these bias voltages within the plasma chamber.

Each of the control electrodes 122-129 is located at a respective control position along the length I of the interior of the plasma chamber 102. It can be seen also, particularly from FIG. 9, that the control electrodes 122-129 are located within the interior of the plasma chamber 102 asymmetrically relative to the central plane 119 of the plasma chamber. As mentioned previously, the casing of the plasma chamber, in particular interior wall faces 140 of the casing (see FIG. 9), constitute the reference electrode with respect to which respective bias voltages are applied to the control electrodes 122-129. Because of the asymmetrical positioning of each control electrode 122-129, with respect to the reference electrode formed by the wall faces 140, the respective bias voltage applied to each of the control electrodes 122-129 provides a respective region of electric field within the interior of the plasma chamber in which the electric field extends transversely to the central plane 119.

Because the reference electrode, formed by the wall faces 140, extends the full length of the plasma chamber, that is over each and every one of the control positions corresponding to the locations along the length of the plasma chamber of the respective control electrodes 122-129, the respective electric field regions corresponding to the different control electrodes, are located along the length of the plasma chamber in accordance with these control positions of the control electrodes.

In order to understand the effect that the transverse electric field region, generated by applying the bias voltage to one of the control electrodes 122-129, can have on charged particles within the plasma chamber, reference should be made to the Article:

"A source with ion extraction from the plasma volume" by B N Makov, Review of Scientific Instruments, Vol. 71, No. 11, November 2000".

This document describes the measured effect within a PIG type ion source of the application of a transverse electric field, by means of an additional electrode within the plasma chamber. So long as the polarity of the transverse electric field with respect to the magnetic field direction, is correct, it has been observed that the extraction current of ions from the ion source through the extraction slit can be increased, by the application of the bias voltage.

The present inventors have realized that this phenomenon can be used in a PIG type ion source, to provide differential control of ion extraction currents at different positions along the length of the extraction slit. This is achieved by employing at least first and second control electrodes to apply respective controlled transverse electric fields at different corresponding control positions along the length of the plasma chamber of the ion source. In the particular embodiment described with reference to the drawings, eight control electrodes, at associated control positions are employed, but advantageous results can be obtained with two or more electrodes, and optionally with five or more electrodes.

Figure 10:
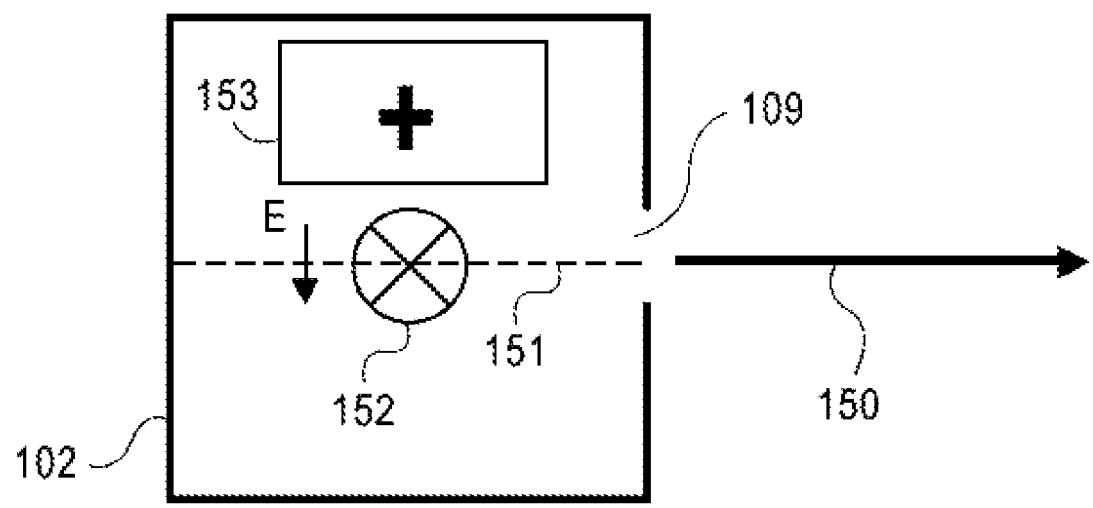
FIG. 10 and FIG. 11 are schematic views of the plasma chamber illustrating the required direction of the transverse electric field relative to the magnetic field.
Figure 11:
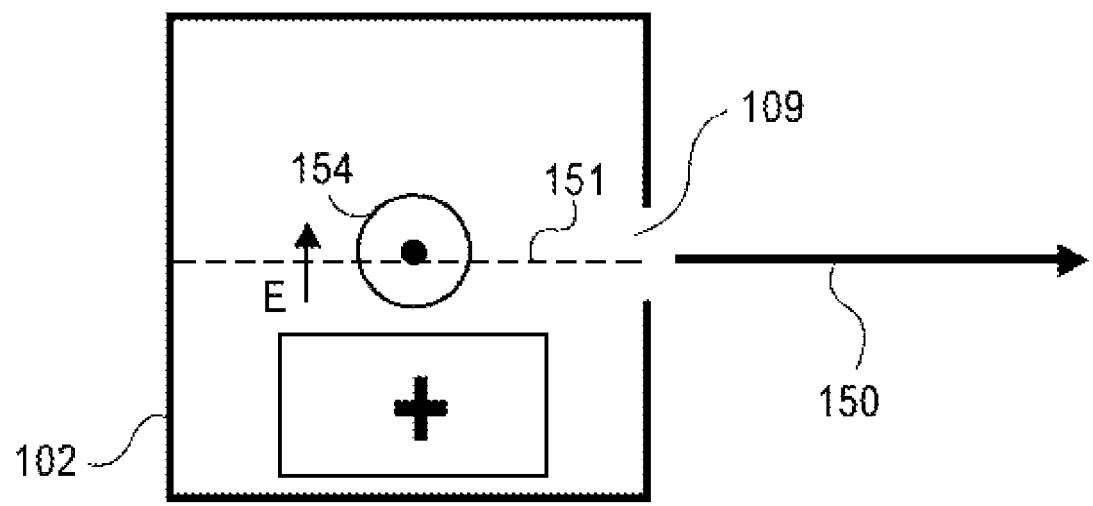

It is important that the polarity of the applied transverse electric field is correct relative to the polarity of the magnetic field running the length of the plasma chamber. FIGS. 10 and 11 illustrate schematically the required electric field orientation. In FIG. 10, for example, the plasma chamber 102 is illustrated schematically from one end, showing the ion extraction slit 109 to the right hand side of the chamber, and arrow 150, representing the direction of an extracted ion beam along the extraction axis. Dashed line 151 illustrates the defined central plane within the plasma chamber and symbol 152 represents a magnetic field directed into the paper of FIG. 10. With such a magnetic field orientation relative to the ion beam extraction direction, positively biased control electrodes, as illustrated at 153 in FIG. 10, should be located generally above the central plane 151, in order to generate electric fields transverse to the central plane 151 in the downwards direction, as illustrated by arrow E.

It should be appreciated that, in the absence of a plasma within the ion chamber, biasing the control electrode 153 positively with respect to the casing of the plasma chamber 102 (as reference electrode) produces electric field lines which will have components transverse to the central plane 151 over the central region of the plasma chamber adjacent the electrode 153. The arrow E in FIG. 10 is shown directly normal to the central plane 151 as a schematic representation of the requirement for the electric field to be transverse to the plane, but it will be understood that the actual field direction in the absence of a plasma may be at any angle to the central plane 151. However in order to achieve the desired incremental extracted ion current, the electric field should have a component which is directed downwards across the central plane 151.

In operation as an ion source, the central region of the plasma chamber, between the cathodes 108, contains a plasma, which, being formed of highly mobile charged particles, has in effect low conductivity, so that an electric field can scarcely be maintained within the plasma region. Nevertheless, in accordance with the description by Makov in the above article, it is suggested that a thin "electric field double layer" is produced through the plasma, separating one plasma region at a potential associated with the plasma chamber wall, which is the anode, and a second plasma region at a slightly higher potential associated with the potential of the biased control electrode 153. An electric field is produced across this thin layer directed from the plasma region of higher potential, associated with the control electrode, towards the plasma region of the lower potential, associated with the plasma chamber anode.

In any case, it has been empirically demonstrated that a positive bias voltage applied to a control electrode 153 located above the central plane 151 of the plasma chamber, where the magnetic field is directed into the plane of the paper in FIG. 10, has the effect of enhancing extracted ion beam current at the position along the extraction slit immediately adjacent the location of the electrode 153. If the direction of the applied magnetic field is reversed, as illustrated by the symbol 154 in the plasma chamber 102 of FIG. 11, then the same enhancement of extracted ion current is observed with the positively biased electrode located below the central plane 151.

In an operational example, the discharge supply 121 may apply a discharge voltage of about 50-200 volts between the anode formed by the casing of the plasma chamber 102, and the cathodes 108. In order to apply useful amounts of control to the ion beam current extracted through the extraction slit 109, particular at each of the control positions along the length l of the plasma chamber, the controllable bias supplies 138-145 should apply a positive bias, controllable between about 0 and about 20 volts relative to the reference electrode, formed by the plasma chamber anode.

It would be understood by those skilled in the art that the available ion current which can be extracted from a PIG type ion source as described is to some degree dependant on the discharge current flowing between the plasma chamber anode and the cathodes 108. However, where the discharge current is at a sufficiently high value, it has been found that suitable adjustment of bias voltages applied to the control electrodes 122-129, can enhance extracted ion current by up to 5 times. More importantly, for the purposes of the described embodiment of the invention, by carefully adjusting the relative bias voltages applied to the different control electrodes along the length of the plasma chamber, it is possible to modify the profile along the extraction slit 109 of the linear current density of ions being extracted through the slit. The linear current density is a measure of ion current per unit length along the slit 109.

So, by controlling the strengths of the respective electric fields applied transversely across the central plane of the plasma chamber, a desired modification can be made to the profile along the extracted slit of the linear current density of ions being extracted through the slit. In the example described above, there are in effect eight individually controllable electric fields at corresponding control positions along the length of the plasma chamber. However, fewer control positions may be useful, so that advantages are obtained whether there are just first and second electric fields at corresponding first and second control positions. Where a finer level of control along the length of the extraction slit is required, more than eight control positions may be provided with corresponding control electrodes and independent controllable bias supplies.

As explained previously, it is important, to enhance extracted ion current, that the controllable electric fields applied transversely relative to the central plane have a polarity, which is selected, dependant on the predetermined magnetic field polarity, such that ions in the plasma are urged towards the extraction slit. For the geometry of control electrodes illustrated, which are biased relative to the casing of the plasma chamber, positive biasing of the control electrodes has been found necessary to obtain an enhancement of extracted ion currents. However, an alternative geometry can be conceived, in which the internal casing of the plasma chamber is divided along its length into electrically insulated frame-like sections, and a single plate reference electrode is provided extending the length of the chamber. Then, each of the separate frame-like sections of the plasma chamber casing can individually be biased negatively relative to the single plate reference electrode, to provide selective controllable enhancement of the extracted ion current at different positions, corresponding to the positions of the casing sections, along the length of the extraction slit.

In general, the example described can be used to control the uniformity of a ribbon ion beam extracted through an elongate slit in the front plate of a plasma chamber of a PIG type ion source. Electric fields are applied to plasma within the plasma chamber of the ion source transverse to the ion extraction direction through the slit and also to the magnetic field in the plasma chamber. As a result, ions in the plasma are urged transversely to both the magnetic and electric fields towards the slit. By adjusting the relative strengths of the electric fields at different locations along the elongate slit, the profile along the elongate slit of the linear current density of ions in the ribbon beam can be modified, to control ribbon beam uniformity as required.

It has been assumed in all the discussion above that the transverse electric field produced by the control electrodes in the plasma chamber should be oriented relative to the magnetic field direction to produce an enhancement of the extracted ion current through the corresponding part of the extraction slit of the ion source. Different amounts of enhancement by applying different bias voltages to the various control electrodes can then adjust the profile along the slit of the linear density extracted ion current.

In some embodiments, the transverse electric field may be oriented, at least one of the control positions along the length of the plasma chamber, so as to reduce, rather than enhance, the extracted ion current at that control position. This is done by applying a bias voltage to the respective control electrode of opposite polarity to the bias used to enhance extracted ion current. So in the examples of FIGS. 10 and 11, control electrode 153 is biased negatively relative to the chamber casing, or anode 102. Negative biasing of selected control electrodes in this way may be used to reduce an excessive peak in the beam intensity profile across the width of the ribbon beam from the slit 109. In this way, adjusting at least one the polarities and the relative strengths of the electric fields at different locations along the elongate slit is effective to modify the profile along the elongate slit of the linear current density of ions in the ribbon beam, for example to make the profile more uniform.

Examples of the invention may also be used with ion sources of the arc type, which resemble the above described PIG or Bernas type ion source, but have a cathode at one end of a plasma chamber only, and no reflecting electrode or cathode at the other end. Such arc type ion sources also have a magnetic field generator providing a magnetic field extending the length of the plasma chamber, typically parallel to the front face with the extraction slit.

In the above described embodiment, the so-called reference electrode is formed by the casing of the plasma chamber. In certain circumstances a separate reference electrode may be employed, extending over the full range of the individual control electrode locations along the length of the plasma chamber. Where the reference electrode is formed by the interior surface of the casing of the plasma chamber, as described in the above embodiments, it can be seen that the reference electrode effectively extends in one or more reference electrode surfaces 140, each of which has a profile, taken in cross-sectional planes normal to the length of the chamber, which is uniform over the length of the chamber. Although the reference electrode surfaces disclosed in the examples are plane surfaces, parallel to the length of the chamber, curved surfaces, having the above required constant profile along the length of the chamber, may be employed.

Similarly, it will be observed that the various control electrodes 122-129 described in the above embodiments, extend in a common control electrode surface which also has a corresponding profile, taken in cross-sectional planes normal to the chamber, which is uniform over the length. Thus in the example, the common control electrode surface is effectively in a control electrode plane which is parallel to the length of the chamber, and also in fact parallel and spaced from the central plane in the chamber.

However, other electrode surface shapes can be envisaged, including cylindrical surfaces, so long as biasing the control electrodes produces electric fields in control regions which extend transverse to the central plane of the plasma chamber with the required polarity to enhance extracted ion current.

The embodiment of the invention described with reference to the drawings employs the novel ion source design in an ion implanter using a ribbon ion beam to enable substrate wafers to be scanned with a single mechanical scan motion of wafers through the ribbon beam. In particular, the described embodiment is useful to provide a source of hydrogen ions for implanting in a process for exfoliating thin laminae of silicon from wafers as set out in detail in the above referred U.S. patent application Ser. No. 12/494,272. However, it will be understood by those skilled in the art that the novel ion source may also be used in other applications in which a ribbon-like beam of ions is required with a controlled profile of beam intensity, or linear beam density, over the large dimension of the beam.

A variety of embodiments have been provided for clarity and completeness. Other embodiments in the invention will be apparent to one of ordinary skill in the art when informed by the present specification. Detailed methods of and systems for implantation have been described herein but any other methods and systems can be used while the results fall within the scope of the invention.

The foregoing detailed description has described only a few of the many forms that this invention may take. For this reason, this detailed description is intended by way of illustration, and not by way of limitation. It is only the following claims, including all equivalents, which are intended to define the scope of this invention.

The invention claimed is:

1. An ion source comprising:
   a plasma chamber having a length;
   a cathode in the plasma chamber for generating a plasma in the chamber;
   a magnetic field generator to produce a magnetic field in said chamber extending in a magnetic field direction along said length;
   said plasma chamber having a front plate defining an ion extraction slit having a center and extending lengthwise of said plasma chamber, whereby charged particles in a plasma formed in said chamber can be extracted through the slit in an extraction direction along an extraction axis through said center of said slit, said magnetic field direction and said extraction axis defining a central plane in said chamber;
   said ion source further including a first control electrode in said plasma chamber located asymmetrically relative to said central plane and at a first control position along said length of said chamber;
   a second control electrode in said plasma chamber located asymmetrically relative to said central plane and at a second control position, displaced from said first control portion, along said length of said chamber;
   and respective first and second control terminals connected to said first and second control electrodes for applying respective bias voltages to said first and second control electrodes.

2. An ion source as claimed in claim 1, wherein said plasma chamber provides at least one reference electrode extending over both said first and said second control positions along said length of said chamber, whereby said respective bias voltages are applied to said first and second control electrodes with respect to said reference electrode.

3. An ion source as claimed in claim 2, wherein said reference electrode is located relative to said central plane such that each of said respective bias voltages provides a respective region of electric field in said chamber in which said electric field extends transversely to said central plane, said respective electric field regions being located along said length of said chamber in accordance with said control positions of said control electrodes.

4. An ion source as claimed in claim 3, wherein said cathode is at one end of the length of said chamber, said reference electrode forming an anode, and said ion source further comprises a discharge supply applied between said cathode and said anode to energize a plasma in said chamber.

5. An ion source as claimed in claim 4, wherein said plasma chamber has a conductive wall forming said reference electrode and said anode.

6. An ion source as claimed in claim 4, including a further cathode at an end of said chamber opposite to said one end.

7. An ion source as claimed in claim 6, wherein said further cathode is connected to said cathode at said one end.

8. An ion source as claimed in claim 1, wherein said cathode is an indirectly heated cathode.

9. An ion source as claimed in claim 1, of the Penning Ionisation Guage (PIG) type or the Bernas type.

10. An ion source as claimed in claim 1, including at least one further control electrode in said discharge chamber located at a respective further control position, displaced from other said control positions, along said length of said chamber;

and a further control terminal connected to said further control electrode for applying a respective further bias voltage to said further control electrode.

11. An ion source as claimed in claim 10, wherein there are at least five said control electrodes distributed along said length of said chamber and respective said control terminals.

12. An ion source as claimed in claim 11, wherein there are eight said control electrodes and respective said control terminals.

13. An ion source as claimed in claim 11, wherein said plasma chamber provides at least one reference electrode extending over all said control positions along said length of said chamber, and located relative to said central plane such that each of said bias voltages is applied to a respective one of said control electrodes with respect to said reference electrode, thereby providing a respective region of electric field in said chamber, in which said electric field extends transversely to said central plane.

14. An ion source as claimed in claim 13, wherein said reference electrode extends in a reference electrode surface which has a first profile, taken in cross-sectional planes normal to said length of said chamber, which is uniform over said length.

15. An ion source as claimed in claim 14, wherein said reference electrode surface is in at least one reference electrode plane parallel to said length of said chamber.

16. An ion source as claimed in claim 13, wherein said control electrodes extend in a common control electrode surface which has a second profile, taken in cross-sectional planes normal to said length of said chamber, which is uniform over said length.

17. An ion source as claimed in claim 16, wherein said common control electrode surface is in a control electrode plane parallel to said length of said chamber.

18. An ion source as claimed in claim 17, wherein said common electrode surface is parallel to and spaced from said central plane in said chamber.

19. A method of generating an ion beam using an ion source comprising a plasma chamber having a length and a cathode in the plasma chamber for generating a plasma in the chamber, a front plate of the plasma chamber defining an ion extraction slit having a center and extending lengthwise of said plasma chamber;

the method comprising the steps of:
producing a magnetic field in said chamber extending in a magnetic field direction along said length;
generating within said chamber a plasma containing ions for said ion beam;
extracting said ions from said plasma through said extraction slit in an extraction direction along an extraction axis through said center of said slit, said magnetic field direction and said extraction axis defining a central plane in said chamber;
applying a first electric field transversely to said central plane in a first region at a first control position along said length of said chamber;
applying a second electric field transversely to said central plane in a second region at a second control position, displaced from said first control position, along said length of said chamber;
and controlling the strengths of said first and second electric fields to apply a desired modification to the profile along the extraction slit of the linear current density of ions being extracted through said slit.

20. A method of generating an ion beam as claimed in claim 19, wherein said magnetic field has a predetermined polarity in said plasma chamber;
and wherein said first and second electric fields are selected to have a polarity, dependant on said predetermined magnetic field polarity, such that ions in the plasma are urged towards said extraction slit.

21. A method of generating an ion beam as claimed in claim 19, wherein said magnetic field has a predetermined polarity in said plasma chamber;
and wherein at least one of said first and second electric fields are selected to have a polarity, dependant on said predetermined magnetic field polarity, such that ions in the plasma are urged away from said extraction slit.

22. A method of generating an ion beam as claimed in claim 19, and further comprising the steps of:
applying at least one further electric field transversely to said central plane in a further region at a further control position, displaced from other said control positions, along the length of said chamber;
and controlling additionally the strength of said further electric field.

23. A method of generating an ion beam as claimed in claim 22, wherein respective electric fields are applied in at least five respective said control positions, and said electric fields are controlled to improve uniformity along the extraction slit of the linear current density of ions being extracted.

24. A method of generating an ion beam as claimed in claim 19, wherein the ion source is of the Penning Ionisation Guage (PIG) type or of the Bernas type.

25. A method of controlling the uniformity of a ribbon ion beam extracted through an elongate slit in a front plate of a plasma chamber which uses a cathode to produces a plasma in the plasma chamber and in which a magnetic field extends through the plasma chamber, the method comprising the steps of:
applying to plasma within the plasma chamber of the ion source electric fields transverse to the ion extraction direction through the slit and also to the magnetic field in the plasma chamber, so that ions in the plasma are urged transversely to both the magnetic and electric fields;
and adjusting at least one the polarities and the relative strengths of the electric fields at different locations along the elongate slit to modify the profile along the elongate slit of the linear current density of ions in the ribbon beam.

26. A method as claimed in claim 25, wherein at least one of the polarities and the relative strengths of the electric fields are adjusted to make the linear current density profile more uniform across the ribbon beam.

27. A method as claimed in claim 25, wherein the ion source is of the Penning Ionisation Guage (PIG) type or the Bernas type.

* * * * *